United States Patent [19]
Inose et al.

[11] Patent Number: 6,031,435
[45] Date of Patent: Feb. 29, 2000

[54] MULTIPLE-STAGE LADDER TYPE SAW FILTER HAVING SERIES RESONATORS WITH DECREASING ELECTRODE PITCHES

[75] Inventors: Naoto Inose; Hok Huor Ou, both of Tokyo, Japan

[73] Assignee: Oki Electric Industry Co., Ltd., Tokyo, Japan

[21] Appl. No.: 09/239,961

[22] Filed: Jan. 29, 1999

[30] Foreign Application Priority Data

Jan. 30, 1998 [JP] Japan .................................. 10-019079

[51] Int. Cl.[7] ...................................................... H03H 9/64
[52] U.S. Cl. .......................... 333/193; 333/194; 333/195; 310/313 B
[58] Field of Search ..................................... 333/193–196; 310/313 R, 313 B, 313 C, 313 D

[56] References Cited

U.S. PATENT DOCUMENTS

| | | | |
|---|---|---|---|
| 5,471,178 | 11/1995 | Hickernell | 333/193 |
| 5,638,036 | 6/1997 | Penunuri et al. | 333/194 |
| 5,726,610 | 3/1998 | Allen et al. | 310/313 B X |
| 5,831,493 | 11/1998 | Ushiroku | 310/313 D X |

FOREIGN PATENT DOCUMENTS

| | | |
|---|---|---|
| 6-338756 | 12/1994 | Japan . |
| 10-242799 | 9/1998 | Japan . |

OTHER PUBLICATIONS

M. Hikita et al., "Experiments of High–Performance SAW Filters for Mobile Radio Transceivers", Transaction of the Institution of Electronics, Information and Communication Engineers, vol. J76–A, No. 2, Feb. 1993, pp. 236–244.

Y. Satoh et al., "A Low–Loss Band–Pass Filter Using SAW Resonators", Transaction of the Institution of Electronics, Information and Communication Engineers, vol. J76–A, No. 2, Feb. 1993, pp. 245–252.

*Primary Examiner*—Robert Pascal
*Assistant Examiner*—Barbara Summons
*Attorney, Agent, or Firm*—Venable; Robert J. Frank; Jeffrey W. Gluck

[57] ABSTRACT

In a multiple stage ladder type SAW filter constructed by cascade-connecting several SAW resonators in the form of a multiple-stage ladder, the electrode pitches of the first stage series-arm SAW resonator through the last stage series-arm SAW resonator, respectively, are gradually decreased. In this case, each stage has a series-arm SAW resonator and a shunt-arm SAW resonator. As a result, the resonance frequencies of the first stage series-arm SAW resonator through the last stage series-arm SAW resonator are increased monotonically from the first stage to the last stage. As a consequence, the frequencies of the upper poles of attenuation generated by the series-arm SAW resonators differ from each other. Therefore, a desired amount of attenuation can be obtained over a wide band.

6 Claims, 10 Drawing Sheets

MULTIPLE-STAGE LADDER TYPE SAW FILTER HAVING SERIES RESONATORS WITH DECREASING ELECTRODE PITCHES

BACKGROUND OF THE INVENTION

1. Field of the Invention

The present invention relates to a multiple-stage ladder type surface-acoustic-wave filter constructed by cascade-connecting one port surface-acoustic-wave resonators (these will be referred to as SAW resonators hereafter) in the form of a multiple-stage ladder.

2. Description of Related Art

As prior arts related to surface-acoustic-wave filters (these will be referred to as SAW filters hereafter) of this type, for example, those described in the following references exist.

REFERENCE 1: THE TRANSACTIONS OF THE INSTITUTE OF ELECTRONICS, INFORMATION AND COMMUNICATION ENGINEERS, J76-A [2] (1993-2) page. 245–252

REFERENCE 2: THE TRANSACTIONS OF THE INSTITUTE OF ELECTRONICS, INFORMATION AND COMMUNICATION ENGINEERS, J76-A [2] (1993-2) page. 236–244

FIG. 1 shows the structure of a conventional SAW resonator. FIG. 2 shows an equivalent circuit of the conventional SAW resonator shown in FIG. 1. This SAW resonator 10 has an interdigital transducer (this will be referred to as "IDT" hereafter) 11 and grating reflectors 12 and 13 installed on both sides of this IDT 11. These grating reflectors 12 and 13 are made of metal strips. This SAW resonator 10 is constructed, for example, by forming an IDT 11 and a pair of reflectors 12 and 13 made of an Al film on a 36° Y-X-LiTaO$_3$ single crystal substrate (this will be referred to as "LT substrate" hereafter).

The SAW resonator 10 is represented by an equivalent circuit in which a capacitance device C2 is parallel-connected with a linear circuit that is formed by serially connecting a reactance device L with a capacitance device C1.

FIG. 3 shows the configuration and principle of a one-stage constant K type filter in which the SAW resonator 10, which is described in the REFERENCE 1, shown in FIG. 1 is used. FIG. 4 shows the admittance characteristics of the SAW resonators 20 and 30 of the filter shown in FIG. 3 and the insertion loss characteristic of the filter. In the graph shown in the upper part of FIG. 4, the vertical axis represents the admittance. In the graph shown in the lower part of FIG. 4, the vertical axis represents the insertion loss (decibel: dB).

This one-stage constant K type filter is constructed as follows. The SAW resonator 10 shown in FIG. 1 is used to form a series-arm SAW resonator 20 and a shunt-arm SAW resonator 30. The series-arm SAW resonator 20 and shunt-arm SAW resonator 30 are then connected in the form of a ladder so that the series-arm SAW resonator 20 will generate an upper pole of attenuation and the shunt-arm SAW resonator 30 will generate a lower pole of attenuation. As a result of this configuration, a band pass filter is formed by setting the resonance frequency of the series-arm SAW resonator 20 equal to the anti-resonance frequency of the shunt-arm SAW resonator 30 based on the theory of constant K type filter.

FIG. 5 shows the configuration of a multiple-stage (4-stage) constant K type filter for explaining the principle of a multiple-stage (for example, 4-stage) constant K type filter in which the SAW resonator 10 described in the REFERENCE 2 and shown in FIG. 1 is used. FIG. 6 shows the insertion loss characteristics of the filter shown in FIG. 5. In FIG. 6, the horizontal axis represents the frequency and the vertical axis represents the insertion loss (dB). The multiple-stage constant K type SAW filter shown in FIG. 5 has a ladder network configuration formed by cascade-connecting multiple ladder stages. In this case, each of the ladder stages is made of a series-arm SAW resonator and a shunt-arm SAW resonator that are formed on a piezoelectric substrate.

Normally, a one-stage constant K type filter as shown in FIG. 3 does not provide a sufficient amount of attenuation. Therefore, in order to provide a sufficient amount of attenuation, one-stage constant K type filters are cascade-connected (for example, in 4-stages) to form a multiple-stage filter. When such a multiple-stage filter is formed, identically constructed stages are cascade-connected. Therefore, the resonance frequencies of the series-arm SAW resonators $20_1$ through $20_4$ and the resonance frequencies of the shunt-arm SAW resonators $30_1$ through $30_4$ are all set equal to each other. However in order to reduce the size of the filter, neighboring series-arm SAW resonators $20_2$ and $20_3$ or neighboring shunt-arm SAW resonators $30_1$ and $30_2$ or neighboring shunt-arm SAW resonators $30_3$ and $30_4$ are combined in some cases. Such neighboring shunt-arm SAW resonators or neighboring series-arm SAW resonators are then replaced with a different resonator having the same resonance frequency. In FIG. 6, the point indicated by A is an upper pole of attenuation formed by the series-arm SAW resonators $20_1$ through $20_4$. The point indicated by B is a lower pole of attenuation formed by the shunt-arm SAW resonators $30_1$ through $30_4$.

The conventional multiple stage constant K type ladder type SAW filter, however, has the following problems (1), (2), and (3).

(1) Normally, a one-stage constant K type ladder type SAW filter as shown in FIG. 3 does not provide a sufficient amount of attenuation. Therefore, in order to provide a sufficient amount of attenuation, one-stage constant K type filters are cascade-connected (for example, in 4-stages) to form a multiple-stage filter shown in FIG. 5. Therefore, the resonance frequencies of the series-arm SAW resonators $20_1$ through $20_4$ and the resonance frequencies of the shunt-arm SAW resonators $30_1$ through $30_4$ are all set equal to each other. Since all the series-arm SAW resonators $20_1$ through $20_4$ resonate at the same frequency, each of the series-arm SAW resonators $20_1$ through $20_4$ anti-resonates and generates the same upper pole of attenuation at the same frequency as shown in FIG. 6. Therefore, a sufficient amount of attenuation can be obtained in a narrow frequency band. However, it is difficult to obtain a wide frequency band in which a sufficient amount of attenuation is secured when a small number (for example four) of stages are used to form a multiple-stage cascade-connected filter. Hence, in order to secure a sufficient amount of attenuation over a wide frequency band, the number of stages used in the multiple-stage cascade-connected filter needs to be increased to a great extent. However, as the number of stages used in the multiple-stage cascade-connected filter is increased, the insertion loss in the pass band is also increased, which is a problem.

On the other hand, a sufficient amount of attenuation can be obtained over a wide frequency band without cascade-connecting any additional stage by reducing the cramp capacitance of each of the series-arm SAW resonators $20_1$ through $20_4$ or by reducing the Q of each of the shunt-arm SAW resonators $30_1$ through $30_4$ by increasing the cramp capacitance of each of the shunt-arm SAW resonators $30_1$ through $30_4$. However, if such a method is used, the insertion loss in the pass band also increases, which is a problem.

(2) FIG. 7 shows the configuration and principle of a multiple-stage (for example, 4-stage) constant K type filter constructed by adding a pole of attenuation to the constant K type filter shown in FIG. 5. FIG. 8 shows the insertion loss characteristic of the filter shown in FIG. 7. In FIG. 8, the horizontal axis represents the frequency and the vertical axis represents the insertion loss (dB). The multiple-stage constant K type SAW filter shown in FIG. 7 also has a ladder network configuration formed by cascade-connecting multiple ladder stages. In this case also, each of the ladder stages is made of a series-arm SAW resonator and a shunt-arm SAW resonator that are formed on a piezoelectric substrate.

There is a method for increasing the amount of attenuation by serially adding poles of attenuation having different frequencies when the attenuation band is set in a higher frequency band than the pass band. Hence, a SAW resonator 21 for adding poles of attenuation is installed in the circuit shown in FIG. 21. In FIG. 8, the local minimum of the graph indicated by C is the upper pole of attenuation formed by the SAW resonator 21. It should be noted, however, that this additional upper pole of attenuation causes the characteristic of this filter in the high frequency side of the pass band to deteriorate as indicated by D in FIG. 8.

Therefore, when this method is used, not only the amount of insertion loss in the pass band increases as shown in FIG. 8 but also the number of required devices increases, causing the chip size to increase.

(3) In the case of the band elimination type filter constructed using only series-arm SAW resonators described in the REFERENCE 2, the resonance frequencies of all the series-arm SAW resonators are changed. In this type of filter, the cramp capacitance of all the series-arm SAW resonators are serially connected in the pass band. As a result, the synthesized cramp capacitance becomes very small. Hence, unless the number of electrode fingers and aperture length of each of the series-arm SAW resonators are increased significantly, the insertion loss in the pass band increases. As a result, the chip size is increased and the insertion loss in the low frequency band of the pass band is also increased, which is a problem.

SUMMARY OF THE INVENTION

Given these problems, it is an object of the present invention to provide a SAW filter capable of obtaining a desired amount of attenuation over a wide frequency band.

A multiple-stage ladder type SAW filter according to the present invention has a ladder network configuration constructed by cascade-connecting multiple ladder stages each of which is made of a series-arm SAW resonator and a shunt-arm SAW resonator formed on a piezoelectric substrate.

Each of the series-arm SAW resonators and each of the shunt-arm SAW resonators have an interdigital transducer made of a one-port surface-acoustic-wave resonator including a first electrode finger group that extends from one side and a second electrode finger group that extends from the opposite side such that electrode fingers of the first electrode finger group and electrode fingers of the second electrode finger group are arranged alternately. The distance between the center lines that bisects the widths of any adjacent electrode fingers of the first electrode finger group and the distance between the center lines that bisects the widths of any adjacent electrode fingers of the second electrode finger group are set to a prescribed electrode pitch.

The electrode pitches of the series-arm SAW resonators are gradually decreased from the first ladder stage to the last ladder stage.

As a result of this configuration, the resonance frequencies of the first stage series-arm SAW resonator through the last stage series-arm SAW resonator are increased monotonically from the first stage to the last stage. As a consequence, the frequencies of the upper poles of attenuation generated by the series-arm SAW resonators differ from each other. Therefore, a desired amount of attenuation can be obtained over a wide band.

It is desirable that the difference between the resonance frequencies of the series-arm SAW resonators of adjacent ladder stages be set to [(width of attenuation band) $\times \alpha$]/ (number of stages $-1$), where $\alpha$ is a constant between 0.4 and 0.8.

DETAILED DESCRIPTION OF THE INVENTION

Figure 1:
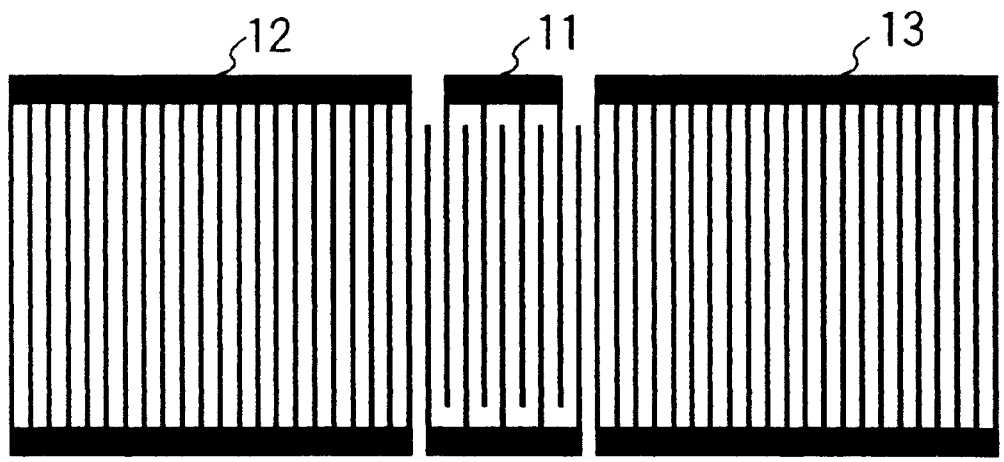
FIG. 1 shows the structure of a conventional SAW resonator.
Figure 2:
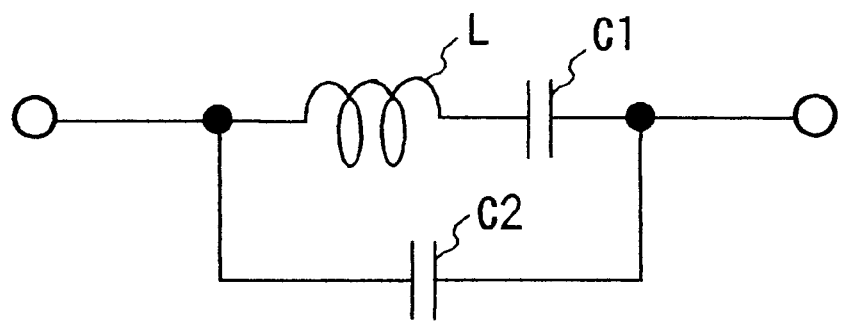
FIG. 2 shows an equivalent circuit of the conventional SAW resonator shown in FIG. 1.
Figure 3:
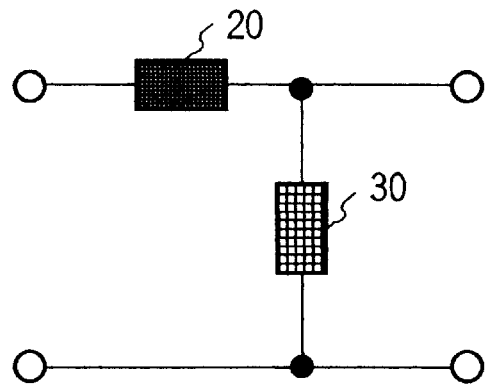
FIG. 3 shows the configuration of a conventional one-stage constant K type filter in which the SAW resonator shown in FIG. 1 is used.
Figure 4:
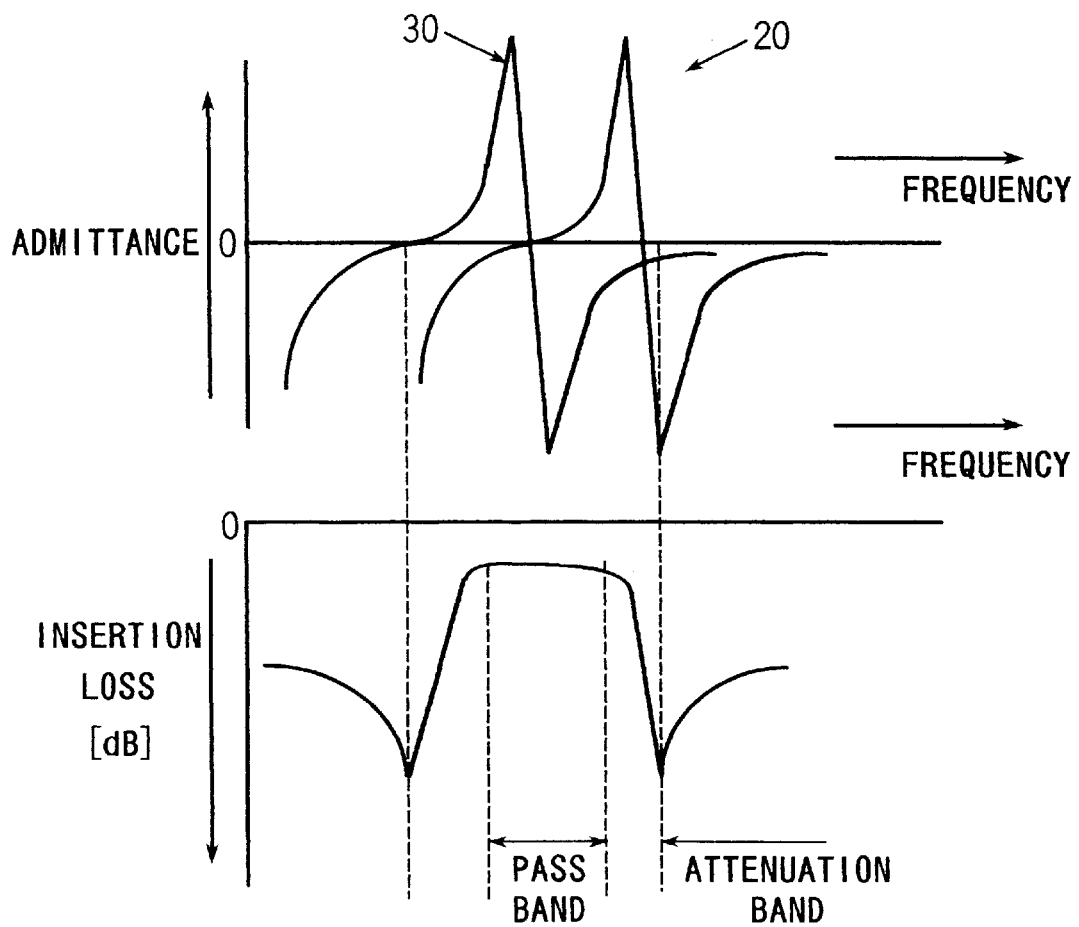
FIG. 4 shows the admittance characteristics and insertion loss characteristic of the filter shown in FIG. 3.
Figure 5:
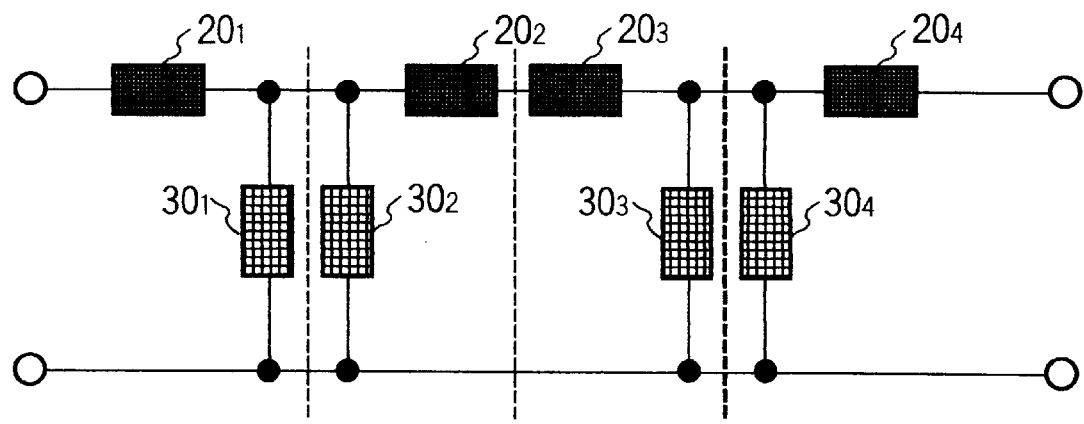
FIG. 5 shows the configuration of a conventional 4-stage constant K type filter in which the SAW resonator shown in FIG. 1 is used.
Figure 6:
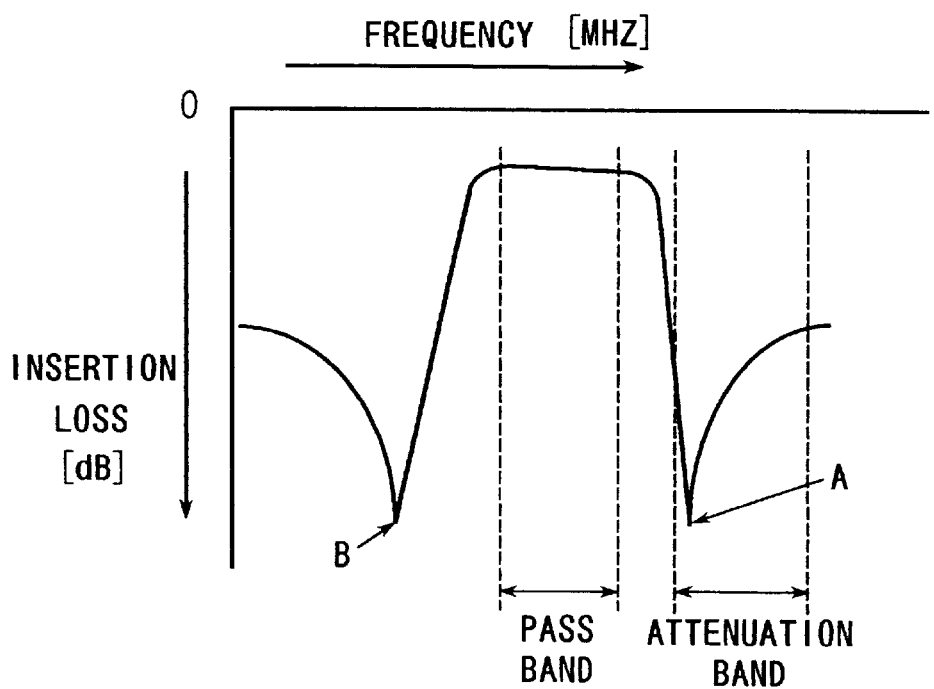
FIG. 6 shows the insertion loss characteristics of the filter shown in FIG. 5.
Figure 9:
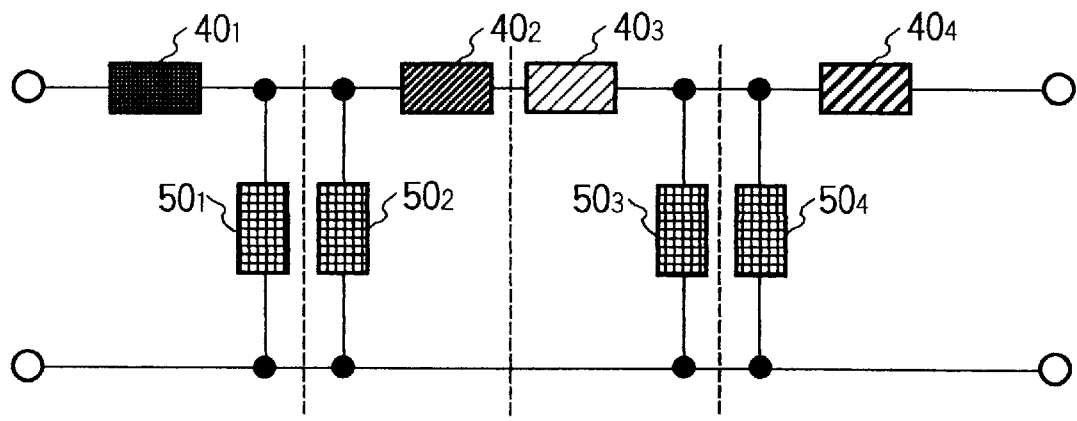
FIG. 9 shows the configuration of a 4-stage ladder type SAW filter according to the present invention.
Figure 10:
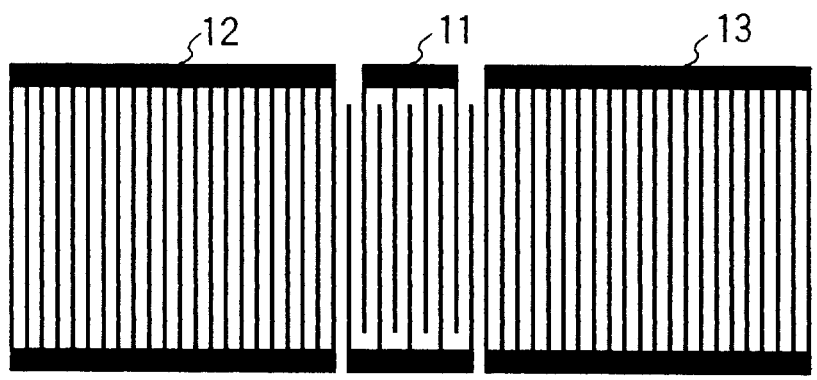
FIG. 10 shows the configuration of a SAW resonator used in the filter shown in FIG. 9.
Figure 11:
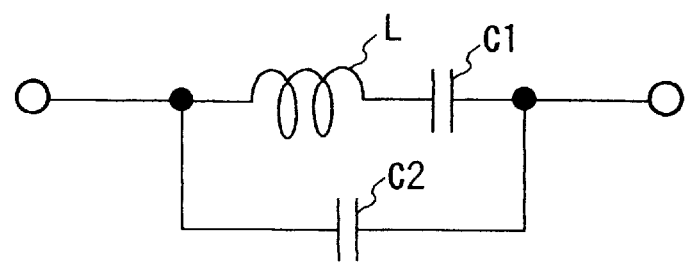
FIG. 11 shows the equivalent circuit of the SAW resonator shown in FIG. 10.

FIG. 9 shows the configuration of a multiple-stage (4-stage in this embodiment) ladder type SAW filter according to an embodiment of the invention. The multiple-stage ladder type SAW filter shown in FIG. 9 has a ladder network configuration formed by cascade-connecting multiple ladder stages. In this case, each of the ladder stages is made of a series-arm SAW resonator and a shunt-arm SAW resonator that are formed on a piezoelectric substrate. This SAW filter has series-arm SAW resonators $40_1$ through $40_4$ and shunt-arm SAW resonators $50_1$ through $50_4$ formed on a piezoelectric substrate. In this SAW filter, the series-arm SAW resonator $40_1$ and shunt-arm SAW resonator $50_1$ form the first stage, the series-arm SAW resonator $40_2$ and shunt-arm SAW resonator $50_2$ form the second stage, the series-arm SAW resonator $40_3$ and shunt-arm SAW resonator $50_3$ form the third stage, and the series-arm SAW resonator $40_4$ and shunt-arm SAW resonator $50_4$ form the fourth stage. In this case, the piezoelectric substrate is made of a ferroelectric single crystal, for example, an LT substrate. Each of the SAW resonators $40_1$ through $40_4$ and $50_1$ through $50_4$ are similarly structured as the conventional ones shown in FIG. 1. FIG. 10 shows the structure of each of the SAW resonators $40_1$ through $40_4$ and $50_1$ through $50_4$. FIG. 11 shows the equivalent circuit of the SAW resonator.

As shown in FIG. 10, each SAW resonator 10 has an interdigital transducer (IDT) 11 for sending and receiving a surface acoustic wave and grating reflectors 12 and 13 installed on both sides of the IDT 11. The IDT 11 is constituted of a one-port SAW resonator. This IDT 11 is made of a first electrode finger group which extends from one side and a second electrode finger group which extends from the other side. The electrode fingers of the first electrode finger group are placed alternately between the electrode fingers of the second electrode finger group. The distance between the centers of any adjacent electrode fingers of the first electrode finger group and the distance between the centers of any adjacent electrode fingers of the second electrode finger group are set to a prescribed electrode pitch P. This SAW resonator 10 is constructed, for example, by forming an IDT 11 and a pair of reflectors 12 and 13 made of an Al film or Al alloy film on a 36° Y-X-LiTaO3 single crystal substrate (this will be referred to as "LT substrate" hereafter). It should be noted that the substrate is not shown in FIG. 10. As shown in FIG. 11, this SAW resonator 10 can be represented by an equivalent circuit formed by parallel-connecting a capacitance device C2 with a linear circuit made of a reactance device L and a capacitance device C1 serially connected to the reactance device L.

Figure 12:
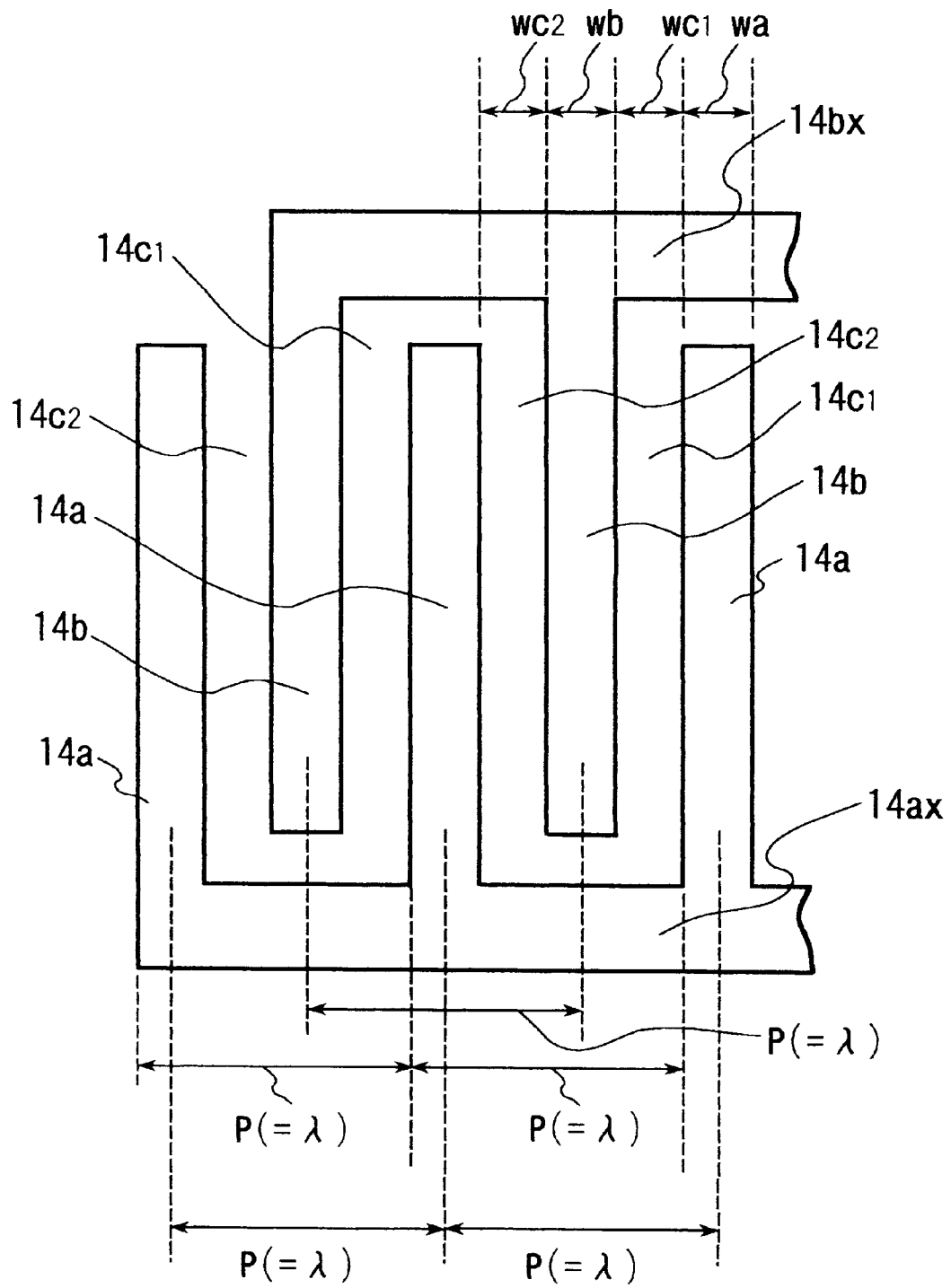
FIG. 12 magnifies a portion of the IDT 11 of the SAW resonator 10 shown in FIG. 10.

FIG. 12 magnifies a portion of the IDT 11 of the SAW resonator 10 shown in FIG. 10. As shown in FIG. 12, the IDT 11 is constituted of a first electrode finger group which extends from one side and a second electrode finger group which extends from the other side. Both the first and second electrode finger groups are made of an Al film. The electrode fingers 14a of the first electrode finger group are placed alternately between the electrode fingers 14b of the second electrode finger group. The gap between each electrode finger of the first electrode finger group and the adjacent electrode finger of the second electrode finger group positioned to the left of the electrode finger of the first electrode finger group is indicated by $14c_1$. Similarly, the gap between each electrode finger of the first electrode finger group and the adjacent electrode finger of the second electrode finger group positioned to the right of the electrode finger of the first electrode finger group is indicated by $14c_2$. All the electrode fingers 14a of the first electrode finger group are connected to a bus bar 14ax. All the electrode fingers 14b of the second electrode finger group are connected to a bus bar 14bx. The width Wa of each of the electrode fingers 14a of the first electrode finger group, the width Wb of each of the electrode fingers 14b of the second electrode finger group, and the width $Wc_1$ of the gap $14c_1$, and the width $Wc_2$ of the gap $14c_2$, normally are set to an equal value. Here, these widths are set equal to ¼ of the wavelength λ of the excitation wave, that is, $Wa=Wb=Wc_1=Wc_2=\lambda/4$. The electrode pitch P is set equal to one wavelength λ, that is, $P=\lambda=Wa+Wb+Wc_1+Wc_2$. In other words, the electrode pitch P is set equal to the distance between the center line that bisects the width of any given electrode finger of the first electrode finger group 14a and the center line that bisects the width of any electrode finger of the first electrode finger group 14a adjacent to the given electrode finger of the first electrode finger group 14a. The electrode pitch P is also set equal to the distance between the center line that bisects the width of any given electrode finger of the second electrode finger group 14b and the center line that bisects the width of any electrode finger of the second electrode finger group 14b adjacent to the given electrode finger of the second electrode finger group 14b.

The width of each electrode finger of the reflectors 12 and 13 and the width of the gap between the electrode fingers of the reflectors 12 and 13 are set equal to the corresponding widths of the electrode fingers and gaps of the IDT 11, respectively. Therefore, in this embodiment, the width of each electrode finger of the grating reflectors 12 and 13 and the width of the gap between the electrode fingers of the grating reflectors 12 and 13 are all set equal to λ/4. The configurations of the grating reflectors 12 and 13 are shown in FIG. 10.

It should be noted here that the width Wa of each electrode finger of the first electrode finger group 14a, the width Wb of each electrode finger of the second electrode finger group 14b, the width $Wc_1$ of the gap $14c_1$, and the width $Wc_2$ of the gap $14c_2$ can be varied within the constraint $P=\lambda=Wa+Wb+Wc_1+Wc_2$.

The characteristics of the present invention is that the electrode pitches $P_1$ through $P_4$ of the series-arm SAW resonators $40_1$ through $40_4$, respectively, are decreased gradually from the first stage to the last stage of the ladder type SAW filter, that is, $P_1>P_2>P_3>P_4$, so that a desired amount of attenuation can be obtained over a wide band. All the series-arm SAW resonators $40_1$ through $40_4$ are structured as described in FIG. 10.

FIGS. 13A through 13E are manufacturing process drawings showing an exemplary method for manufacturing the SAW filter shown in FIG. 9.

Figure 13A:
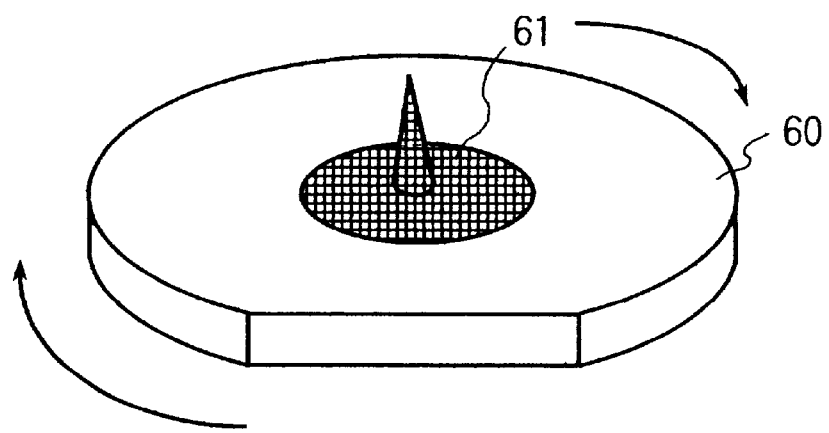
FIG. 13A shows the resist coating process in manufacturing the filter shown in FIG. 9.

When the SAW filter shown in FIG. 9 is manufactured, a resist 61 is first coated on the entire pattern formation surface of the LT substrate 60 to form a resist film 61 using a method such as the spin-coat method or the like shown in FIG. 13A.

Figure 13B:
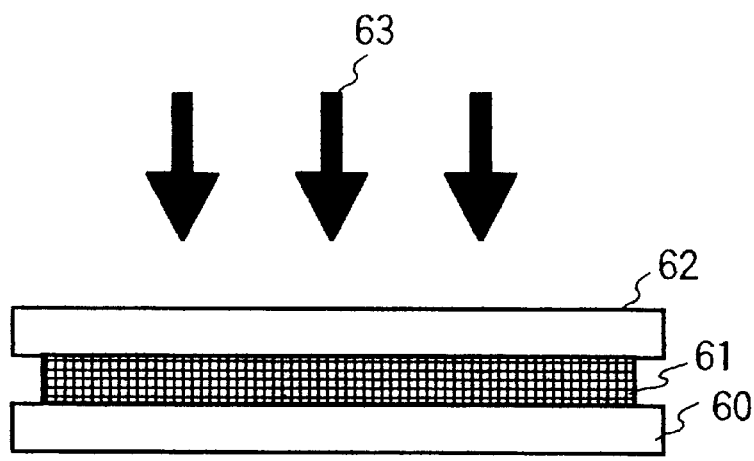
FIG. 13B shows the exposure process in manufacturing the filter shown in FIG. 9.

In the exposure process shown in FIG. 13B, a SAW filter pattern is transferred via light 63 onto the resist film 61 using an optical mask 62.

Figure 13C:
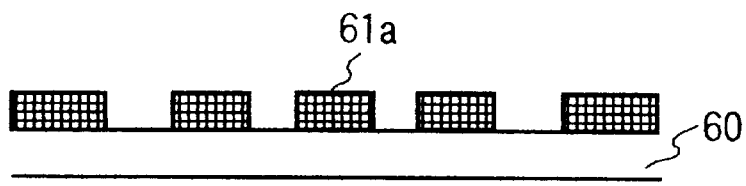
FIG. 13C shows the resist patterning process in manufacturing the filter shown in FIG. 9.

In the resist patterning process shown in FIG. 13C, the resist film 61 is developed to form a resist pattern 61a. The remaining unwanted portion of the resist film 61 is then removed.

Figure 13D:
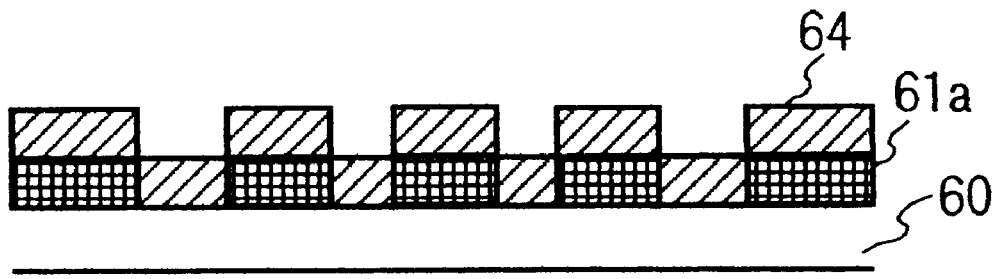
FIG. 13D shows the conductive film depositing process in manufacturing the filter shown in FIG. 9.

In the conductive film depositing proceed shown in FIG. 13D, a conductive film 64 made of Al or Al alloy is deposited on the entire pattern formation surface of the LT substrate 60.

Figure 13E:
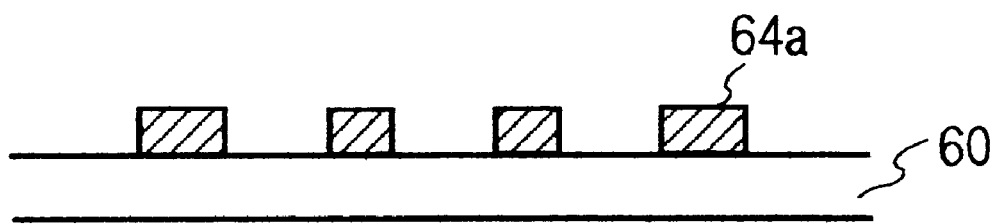
FIG. 13E shows the electrode formation process in manufacturing the filter shown in FIG. 9.

In the electrode formation process shown in FIG. 13E, an organic solvent is applied to remove the unwanted portion of the conductive film 64 together with the pattern 61a of the resist film 61 using the lift-off method. As a result, the electrodes 64a of the IDT 11, reflectors 12 and 13 shown in FIG. 10 are formed.

The operation of the SAW filter manufactured in this way will now be explained.

The resonance frequencies of the series-arm SAW resonators $40_1$ through $40_4$ are denoted by f1rs through f4rs, respectively. The anti-resonance frequencies of the series-arm SAW resonators $40_1$ through $40_4$ are denoted by f1as through f4as, respectively. The resonance frequencies of the shunt-arm SAW resonators $50_1$ through $50_4$ are denoted by f1rp through f4rp, respectively. The anti-resonance frequencies of the shunt-arm SAW resonators $50_1$ through $50_4$ are denoted by f1ap through f4ap, respectively. In the present embodiment, these frequencies are prescribed as follows.

$$f1rs = f1ap, f2rs > f2ap, f3rs > f3ap, f4rs > f4ap \quad (1a)$$

$$f4rs > f3rs > f2rs > f1rs \quad (1b)$$

$$f4rp = f3rp = f2rp = f1rp \quad (1c)$$

$$f4ap = f3ap = f2ap = f1ap \quad (1d)$$

Here, in order to satisfy the relation f4rs>f3rs>f2rs>f1rs, the electrode pitches $P_1$ through $P_4$ of the first through fourth stage series-arm SAW resonators $40_1$ through $50_4$, respectively are set to satisfy the relation $P_1>P_2>P_3>P_4$.

In this case, denoting the frequency difference between any adjacent series-arm SAW resonators by FP, the resonance frequencies f1rs through f4rs of the series-arm SAW resonators $40_1$ through $40_4$, respectively, are set so that they satisfy the relation $$FP=[(\text{width of attenuation band})\times\alpha]/(\text{number of stages }-1)=f2rs-f1rs=f3rs-f2rs=f4rs-f3rs \quad (2).$$

Here, $\alpha$ is an experimentally determined constant. In the present embodiment, $\alpha$ has been experimentally determined to 0.6±0.2. Here, ±0.2 indicates the admissible range of error of the constant $\alpha$. That is, the constant $\alpha$ lies in the range $0.4 \geq \alpha \geq 0.8$ that is centered at 0.6. Therefore, in the present embodiment, the relation FP=[(width of attenuation band)× (0.6±0.2)]/(number of stages–1) is satisfied.

Here, the resonance frequencies f1rs through f4rs of the series-arm SAW resonators $40_1$ through $40_4$, respectively, are set as follows, for example.

Since the number of stages is four in this embodiment, choosing $\alpha$=0.6, FP turns out to be FP=(width of attenuation band)×0.6/3. Therefore, in accordance with equation (2), f2rs, f3rs, and f4rs satisfy the relation.

$$f2rs=f1rs+(\text{width of attenuation band})\times0.6/3\times1 \quad (3a)$$

$$f3rs=f1rs+(\text{width of attenuation band})\times0.6/3\times2 \quad (3b)$$

$$f4rs=f1rs+(\text{width of attenuation band})\times0.6/3\times3 \quad (3c)$$

In the SAW filter of the present embodiment, the relations (1a) through (1d) hold. That is, in the first stage, the resonance frequency of the series-arm SAW resonator $40_1$ and the anti-resonance frequency of the shunts-arm SAW resonator $50_1$ are the same. In the second, third, and fourth stages, the resonance frequency of the series-arm SAW resonator $40_i$ is set higher than the anti-resonance frequency of the shunt-arm SAW resonator $50_i$, where i=2, 3, 4. Thus, in the resultant multiple stage ladder type filter, the first stage is equivalent to a constant K type filter. The lower limit of frequency of the pass band is the same for each of the first through last stages of this filter. However, the upper limit of frequency of the pass band is increased gradually from the first stage to the last stage.

Since the first through fourth stages of the filter having different band widths, respectively, are cascade-connected, the poles of attenuation of the series-arm SAW resonators $40_1$ through $40_4$ are synthesized. In this case, the frequencies of the upper poles of attenuation are different from each other. Therefore, a wide attenuation band is formed on the high frequency side using only four stages. Since f2rs>f2ap, fb3rs>fb3ap, and fb4rs>fb4ap, the second through fourth stages of the filter do not satisfy the defining condition of the constant K type filter. As a result, the insertion loss in the pass band increases slightly. However, since the amount of frequency shift at each stage is small, the insertion loss does not increase as much as in the case in which the number of stages is increased.

Figure 14:
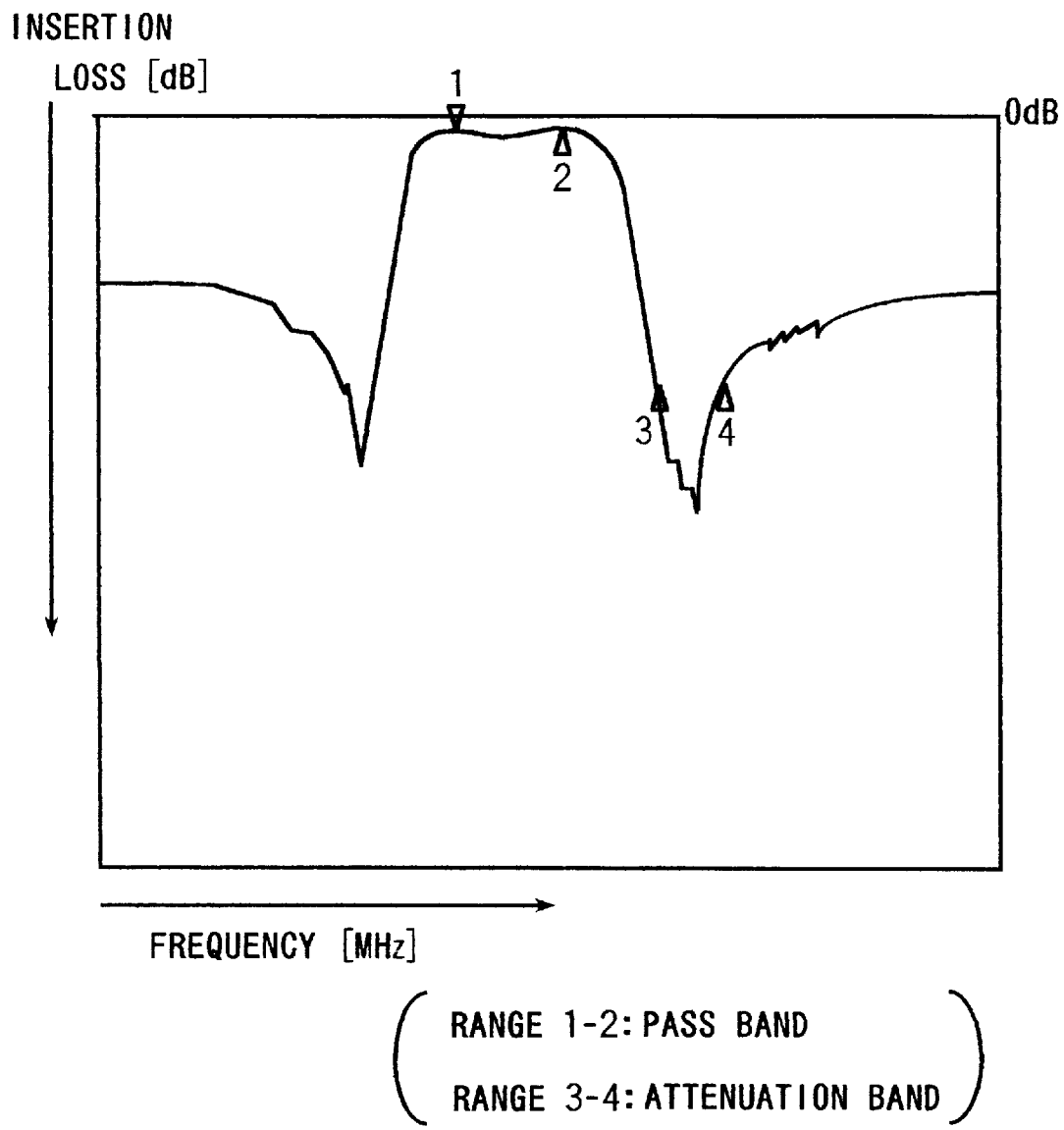
FIG. 14 shows the insertion loss characteristic of the SAW filter shown in FIG. 9.

FIG. 14 shows the insertion loss characteristic of the SAW filter shown in FIG. 9. In FIG. 14, the horizontal axis represents the frequency, and the vertical axis represents the insertion loss (dB). The frequency range 1–2 indicated between 1 and 2 is the pass band, and the frequency range 3–4 indicated between 3 and 4 is the attenuation band.

Figure 15:
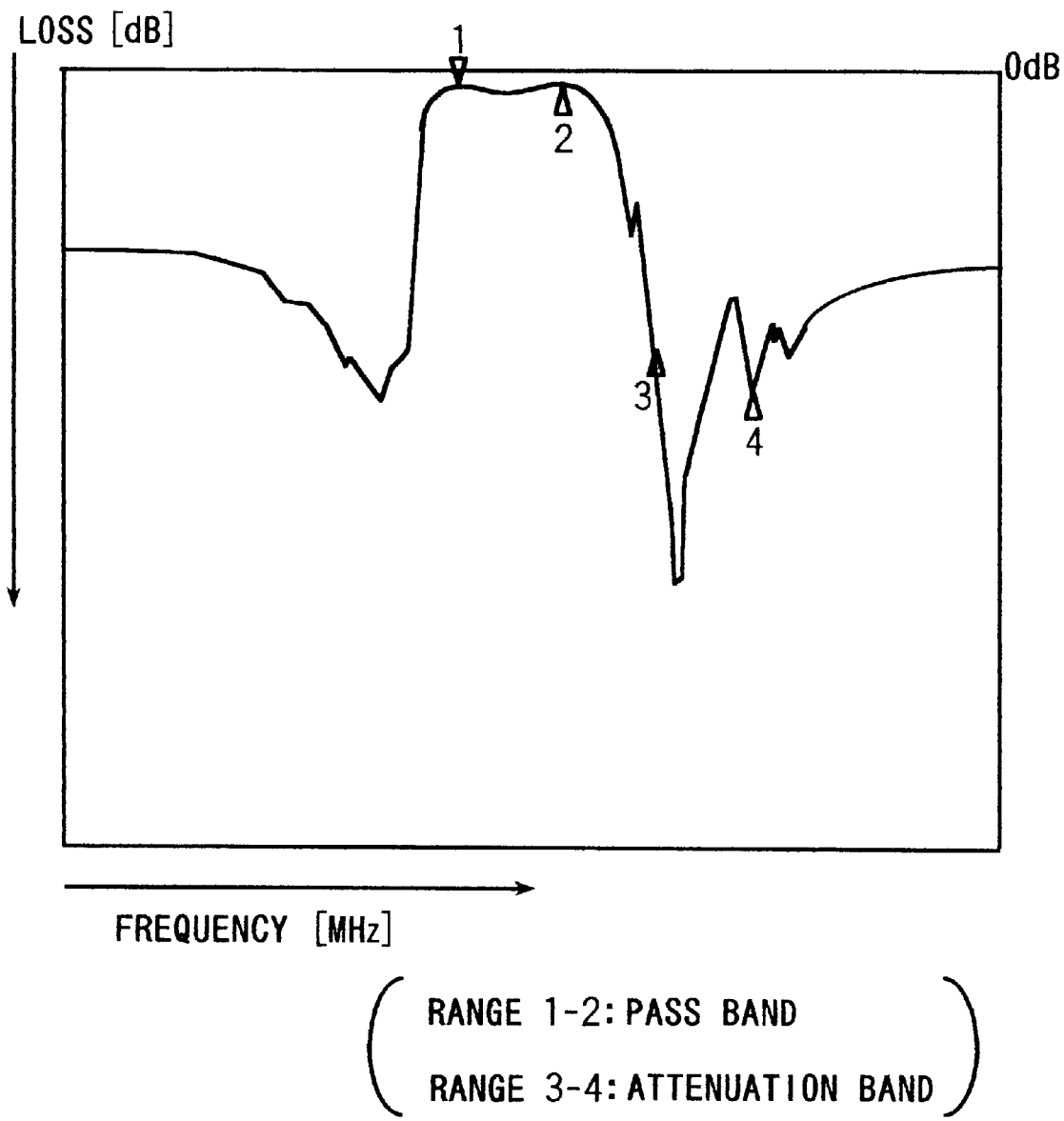
FIG. 15 shows the insertion loss characteristic of the conventional SAW filter.

FIG. 15 shows the insertion loss characteristic of the conventional 4-stage ladder type SAW filter. In FIG. 15 also, the horizontal axis represents the frequency, and the vertical axis represents the insertion loss (dB). This conventional 4-stage ladder type SAW filter is the ladder type SAW filter shown in FIG. 7. In this conventional 4-stage ladder type SAW filter, the electrode pitch of each of the series-arm SAW resonators is set to the same length. In FIG. 15 also, the frequency range 1–2 indicated between 1 and 2 is the pass band, and the frequency range 3–4 indicated between 3 and 4 is the attenuation band. In this conventional case, one pole 4 of attenuation having a different frequency is inserted serially to increase the amount of attenuation.

In the SAW filter of the present embodiment having four stages on an LT substrate, for example, when the proportion of the width of the attenuation band with respect to the center frequency of the pass band is 2.84%, by shifting the frequency of the upper pole of attenuation of each of the second, third, and fourth stage series-arm SAW resonators $40_2$, $40_3$, and $40_4$ to the higher frequency side by the proportion of 0.57% with respect to the center frequency of the pass band, the attenuation band having a desired band width is obtained. In comparison with the characteristic of the conventional case shown in FIG. 15 in which an upper pole of attenuation having a different frequency is inserted serially to increase the amount of attenuation, the attenuation band of the filter of the present invention is wider than that of the conventional filter. Moreover, in comparison with a conventional 5-stage type filter having the same amount of attenuation, the insertion loss characteristics of the filter of the present invention is improved.

Thus according to the present invention, in the SAW filter constructed by cascade-connecting four ladder stages, the electrode pitches $P_1$, $P_2$, $P_3$ and $P_4$ of the first stage series-arm SAW resonator $40_1$ through the fourth stage series-arm SAW resonator $40_4$, respectively, are decreased gradually, that is, $P_1>P_2>P_3>P_4$. As a result, the frequencies of the upper poles of attenuation generated by the first stage series-arm SAW resonator $40_1$ through the fourth stage series-arm SAW resonator $40_4$ differ from each other. Therefore, the width of the attenuation band is increased.

The filter according to the present invention has the following advantages.

(1) SAW filters having a low insertion loss can be achieved without increasing the number of stages significantly.

Figure 7:
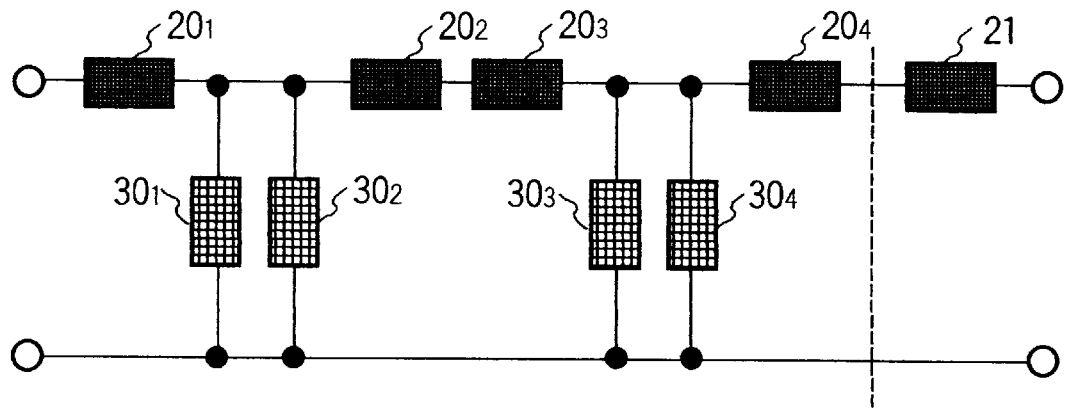
FIG. 7 shows the configuration of a conventional 4-stage constant K type filter in which an upper pole of attenuation is added to the filter shown in FIG. 5.
Figure 8:
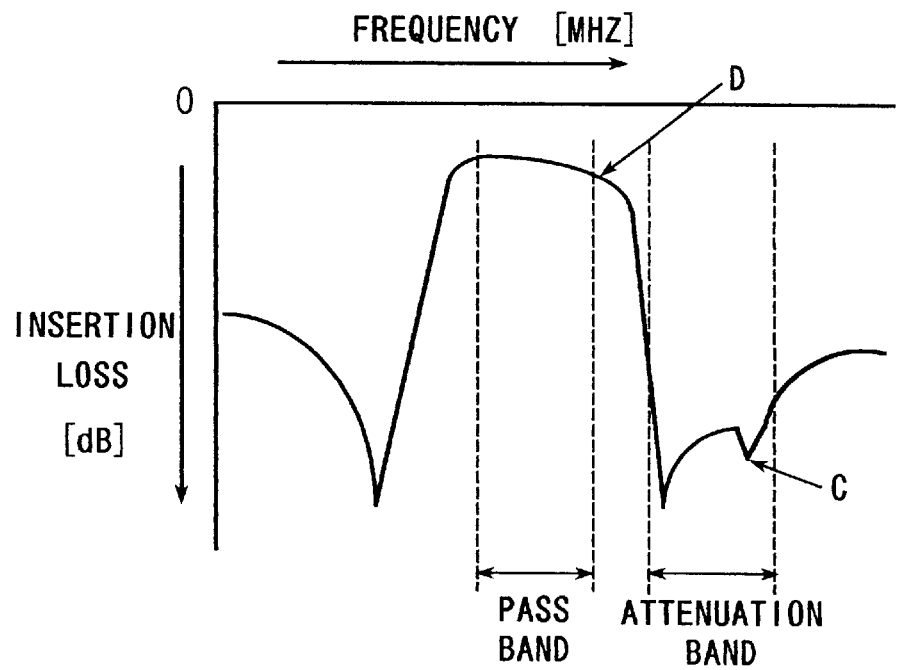
FIG. 8 shows the insertion loss characteristics of the filter shown in FIG. 7.

(2) Since the poles of attenuation are distributed over a wide range, there is no need to serially connect an additional SAW resonator 21 to the last stage as shown in FIG. 7 so as to add another pole of attenuation. Hence, the chip size is reduced.

(3) Since the electrode pitches $P_1$, $P_2$, $P_3$ and $P_4$ of the first stage series-arm SAW resonator $40_1$ through the fourth stage series-arm SAW resonator $40_4$, respectively, are decreased gradually, that is, $P_1 > P_2 > P_3 > P_4$, even if each of the series-arm SAW resonators $40_1$ through $40_4$ has the same number of electrode fingers and the same aperture length, the frequencies of other unwanted resonance modes and the frequencies of spurious modes such as longitudinal resonance modes and transverse resonance modes of the series-arm SAW resonators $40_1$ through $40_4$ differ from one series-arm SAW resonator to another. As a result, the effects of these modes on the pass band and attenuation band are diminished.

(4) In comparison with a band elimination type filter structured as the one described in the REFERENCE 2, according to the present invention, neither the number of electrode fingers nor the aperture length of each of the resonators needs to be increased. Therefore, the chip size is reduced.

(5) In comparison with a band elimination type filter structured as the one described in the REFERENCE 2, according to the present invention, the insertion loss in the low frequency side of the pass band (that is, the slope of the pass band) is reduced.

(6) Since the present invention does not require any particular complicated manufacturing process, the manufacturing facility of the prior art can be used to manufacture the filter of the present invention.

It should be noted that the range of technical applications of the present invention is not limited to this embodiment. Two exemplary variations and modifications of the above-described embodiments are provided below.

(i) In the embodiment of the present invention, the SAW filter has four stages. However, in constructing a SAW filter having any number of stages, the relation FP=(width of attenuation band)×0.6]/(number of stages −1) on the resonance frequency difference between adjacent series-arm SAW resonators can be used to determine the electrode pitch of the series-arm SAW resonator of each stage in the same manner as described in equations (3a), (3b) and (3c). As a result, the desired attenuation band is obtained.

(ii) In the embodiment, the SAW filter has been formed on an LT substrate (36° Y-X-LiTaO₃ single crystal substrate). However, the same advantages are obtained if this filter is formed on a substrate made of another piezoelectric material or a piezoelectric substrate made of a ferroelectric single crystal (for example, 64° Y-X-LiNbO₃, 41° Y-X-LiNbO₃, 128° Y-X-LiNbO₃, or 0° Y-Z-LiNbO₃, or the like). The structure of each of the SAW resonators $40_1$ through $40_4$ and $50_1$ through $50_4$ may be different from the one shown in FIG. 10.

Thus, according to the present invention, in a multiple stage ladder type SAW filter constructed by cascade-connecting several SAW resonators in the form of a multiple-stage ladder having a pass band and an attenuation band that is located in a higher frequency range than the pass band, the electrode pitches of the first stage series-arm SAW resonator through the last stage series-arm SAW resonator, respectively, are monotonically decreased gradually from the first stage to the last stage. As a result, the resonance frequencies of the first stage series-arm SAW resonator through the last stage series-arm SAW resonator are increased monotonically from the first stage to the last stage. As a consequence, the frequencies of the upper poles of attenuation generated by these series-arm SAW resonators differ from each other. Therefore, a desired amount of attenuation can be obtained over a wide band.

As a result, thee filter according to the present invention can be constructed without using a large number of stages so as to increase the amount of attenuation. Hence, a filter having a low insertion loss characteristic can be achieved. Moreover, since the number of required devices is reduced, the chip size is also reduced. Furthermore, according to the present invention, even if each of the series-arm SAW resonators has the same number of electrode fingers and the same aperture length, the frequencies of other unwanted frequency modes and the frequencies of spurious modes such as longitudinal resonance modes and transverse resonance modes of the series-arm SAW resonators differ from one series-arm SAW resonator to another. As a result, the effects of these modes on the pass band and attenuation band are diminished. In addition, in comparison with the conventional band elimination type filters, neither the number of electrode fingers of the resonators nor the aperture length needs to be increased. Therefore, the chip size is reduced and the insertion loss in the low frequency side of the pass band is reduced.

What is claimed:

1. A multiple-stage ladder type SAW filter having a ladder network configuration constructed by cascade-connecting a plurality of ladder stages such that each of said ladder stages is made of a series-arm SAW resonator and a shunt-arm SAW resonator formed on a piezoelectric substrate, wherein each of said series-arm SAW resonators and each of said shunt-arm SAW resonators comprise an inter-digital transducer having a first electrode finger group that extends from one side and a second electrode finger group that extends from an opposite side such that electrode fingers of said first electrode finger group and electrode fingers of said second electrode finger group are arranged alternately and such that a distance between a center line that bisects a width of any given electrode finger of said first electrode finger group and a center line that bisects a width of any electrode finger of said first electrode finger group adjacent to said given electrode finger of said first electrode finger group is set to a prescribed electrode pitch, and such that a distance between a center line that bisects a width of any given electrode finger of said second electrode finger group and a center line that bisects a width of any electrode finger of said second electrode finger group adjacent to said given electrode finger of said second electrode finger group is also set to said prescribed electrode pitch and wherein said electrode pitches of said series-arm SAW resonators are gradually decreased from a first ladder-stage to a last ladder-stage.

2. A multiple-stage ladder type SAW filter as claimed in claim 1, wherein such of said resonators further comprises grating reflectors on both sides of said inter-digital transducer.

3. A multiple-stage ladder type SAW filter as claimed in claim 1, wherein resonance frequencies of said series-arm SAW resonators are increased stage by stage from a first ladder stage to said last ladder stage.

4. A multiple-stage ladder type SAW filter as claimed in claim 3, wherein a difference between resonance frequencies of said series-arm SAW resonators of adjacent ladder stages is set to [(width of attenuation band)×α]/(number of stages −1), where α is a constant between 0.4 and 0.8.

5. A multiple-stage ladder type SAW filter as claimed in claim 1, wherein said piezoelectric substrate is a ferroelectric single crystal substrate.

6. A multiple-stage ladder type SAW filter as claimed in claim 5, wherein said ferroelectric single crystal substrate is made of one material selected from a single-crystal group consisting of a 36° Y-X-LiTaO$_3$ single crystal, a 64° Y-X-LiNbO$_3$ single crystal, a 41° Y-X-LiNbO$_3$ single crystal, a 128° Y-X-LiNbO$_3$ single crystal and a 0° Y-Z-LiNbO$_3$ single crystal.

* * * * *

UNITED STATES PATENT AND TRADEMARK OFFICE
CERTIFICATE OF CORRECTION

PATENT NO.    : 6,031,435
DATED         : February 29, 2000
INVENTOR(S)   : Naoto Inose It is certified that error appears in the above-identified patent and that said Letters Patent is hereby corrected as shown below:

Column 1,
Lines 14-16, delete in their entirety and insert -- The following references relate to surface-acoustic-wave (SAW) filters of the type discussed here: --; and
Line 62, change "filter" to -- filters --.

Column 2,
Line 2, after "frequency" insert -- , --;
Line 20, after "However" insert -- , --;
Line 52, change "secured" to -- obtained --;
Line 53, after "example" insert -- , --; and
Line 55, change "secure" to -- obtain --.

Column 3,
Line 10, after "frequency" insert -- , --;
Line 23, change "21" to -- 7 --;
Line 31, after "8" insert -- , --;
Line 37, change "capacitance" to -- capacitances --;
Line 43, after "increased" insert -- , --;
Line 53, after "stages" insert -- , --;
Line 58, change "have" to -- has --;
Lines 65 and 67, change "bisects" to -- bisect --.

Column 4,
Line 12, change "Therefore" to -- By so doing --;
Lines 29, 59 and 61, change "characteristic" to -- characteristics --.

Column 5,
Line 19, delete "similarly" and change "as" to -- similarly to --;
Lines 31 and 32, delete "are placed alternately between the electrode fingers of the second electrode finger group", and insert therefor -- and the electrode fingers of the second electrode finger group are arranged alternately --; and
Lines 54-56, change "are placed alternately between the electrode fingers 14b of the second electrode finger group" to -- and the electrode fingers 14b of the second electrode finger group are arranged alternately --.

UNITED STATES PATENT AND TRADEMARK OFFICE
CERTIFICATE OF CORRECTION

PATENT NO.    : 6,031,435
DATED         : February 29, 2000
INVENTOR(S)   : Naoto Inose It is certified that error appears in the above-identified patent and that said Letters Patent is hereby corrected as shown below:

Column 6,
Line 26, change "width" to -- widths --;
Line 27, change "each" to -- the -- and change "finger" to -- fingers --;
Line 28, change "width" to -- widths -- and change "gap" to -- gaps --; and
Line 38, change "characteristics" to -- characteristic --.

Column 7,
Line 63, change "shunts" to -- shunt --.

Column 8,
Line 8, change "band widths" to -- bandwidths --;
Lines 48 and 49, change "band width" to -- bandwidth --;
Line 57, change "is" to -- are --; and
Line 58, after "Thus" insert -- , --.

Column 10,
Line 11, delete "thee" insert -- the --;
Lines 12 and 13, delete "without using a large number of stages so as"; and after "attenuation" insert -- without using a large number of stages --;
Line 14, delete "a", and change "characteristic" to -- characteristics --;
Line 24, delete "the";
Line 27, after "reduced" insert -- , --; and
Line 66, delete "a" insert -- said --.

Signed and Sealed this

Eighth Day of April, 2003

JAMES E. ROGAN
*Director of the United States Patent and Trademark Office*